(12) United States Patent
Conner

(10) Patent No.: US 12,408,554 B2
(45) Date of Patent: Sep. 2, 2025

(54) ELECTRO-THERMAL MATERIALS MADE FROM LOW- DIMENSIONAL CARBON STRUCTURES IN A POLYMER MATRIX

(71) Applicant: The Endeavour Group, Inc., Salt Lake City, UT (US)

(72) Inventor: Andrew Conner, West Jordan, UT (US)

( * ) Notice: Subject to any disclaimer, the term of this patent is extended or adjusted under 35 U.S.C. 154(b) by 476 days.

(21) Appl. No.: 16/570,829

(22) Filed: Sep. 13, 2019

(65) Prior Publication Data
US 2021/0083163 A1    Mar. 18, 2021

(51) Int. Cl.
| | | |
|---|---|---|
| *H10N 10/856* | (2023.01) | |
| *C09D 5/24* | (2006.01) | |
| *C09D 5/26* | (2006.01) | |
| *C09D 7/40* | (2018.01) | |
| *C09D 11/037* | (2014.01) | |
| *C09D 11/322* | (2014.01) | |
| *H10N 10/01* | (2023.01) | |
| *H10N 10/82* | (2023.01) | |
| *H10N 10/857* | (2023.01) | |

(52) U.S. Cl.
CPC ............ *H10N 10/856* (2023.02); *C09D 5/24* (2013.01); *C09D 5/26* (2013.01); *C09D 7/70* (2018.01); *C09D 11/037* (2013.01); *C09D 11/322* (2013.01); *H10N 10/01* (2023.02); *H10N 10/82* (2023.02); *H10N 10/857* (2023.02)

(58) Field of Classification Search
CPC ......... H01L 35/26; H01L 35/10; H01L 35/34; H01L 37/025; H01L 35/22; C09D 5/24; C09D 5/26; C09D 7/70; C09D 11/037; C09D 11/322; C09D 7/61; C08K 3/041; C08K 3/042; C08K 3/045; C08K 3/046
See application file for complete search history.

(56) References Cited

U.S. PATENT DOCUMENTS

| | | | | |
|---|---|---|---|---|
| 6,762,237 | B2 * | 7/2004 | Glatkowski | ............ B82Y 10/00 524/495 |
| 2016/0185983 | A1 * | 6/2016 | Lui | .......... C09D 5/24 219/553 |

\* cited by examiner

*Primary Examiner* — Michael Y Sun
(74) *Attorney, Agent, or Firm* — Dax D. Anderson; Kirton McConkie

(57) ABSTRACT

Compositions, and methods of obtaining them, useful for lithium ion batteries comprising discrete oxidized carbon nanotubes having attached to their surface lithium ion active materials in the form of nanometer sized crystals or layers. The composition can further comprise graphene or oxygenated graphene.

14 Claims, 2 Drawing Sheets

ELECTRO-THERMAL MATERIALS MADE FROM LOW- DIMENSIONAL CARBON STRUCTURES IN A POLYMER MATRIX

TECHNICAL FIELD

The present disclosure relates generally to thermoelectric materials. More particularly, the disclosure relates to forming nanostructures in a polymer matrix.

BACKGROUND

Materials whose properties predictably change when a stimulus is applied are often called smart materials. Smart materials have many applications in a variety technology fields. An example of smart materials includes thermoelectric materials. The thermoelectric effect refers to phenomena by which either a temperature difference creates an electric potential or an electric potential creates a temperature difference. Engineering materials on the nanoscale can produce unique material with properties which are highly selectable for optimizing energy conversion, including generating heat from nanostructures. Carbon nanostructures such as fullerenes, CNTs, CNFs, graphene, as well as related structures show promise as nanomaterials to be used in the development of smart composites, sensors, and nanoscale electronic devices. However, to optimize a materials properties nanostructures are integrated into another material. Combining a small fraction of CNTs with a polymer provides significant improvements in the composite mechanical strength (owing to the CNTs mechanical strength) making them suitable candidates for novel polymer composites. The physical properties and performance of polymer matrix in nanocomposites can be improved by adding small percentages of CNTs.

Despite these recent advances there exists a need for materials and techniques for integrating low-dimensional carbon structures into electro-thermal materials wherein the nanostructure mixture can be below a percolation limit of each of the at least two low-dimensional nanostructures within the polymer matrix when the composition is cured.

BRIEF SUMMARY

The general purpose of the systems and methods disclosed herein is to provide an improved electricrothermal material that can generate heat from nano structures formed in a polymer matrix. Specifically, the nanostructures mixture can comprise at least two low-dimensional nanostructures while the mixture can be below a percolation limit of each of the at least two low-dimensional nanostructures within the poly matrix when the composition is cured. In some embodiments one nanostructure exceeds the percolation limit. The electrothermal (ET) coating can be comprised of any combination of low dimensional carbon nanostructures. The nanostructure types in the ET coating can include any combination of a nanospheroid, a linear nanostructure, and/ or a planar nanostructure. The quantity of nanostructures within the polymer matrix can vary based on the type of nanostructures in the ET coating and the desired use. The ET coating can be coated on many different types of substrates. Moreover, the ET coating can be applied to the substrate using any number of techniques.

BRIEF DESCRIPTION OF THE DRAWINGS

In order to describe the manner in which the advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE INVENTION

The present embodiments of the present invention will be best understood by reference to the drawings, wherein like parts are designated by like numerals throughout. It will be readily understood that the components of the present invention, as generally described and illustrated in the figures herein, could be arranged and designed in a wide variety of different configurations. Thus, the following more detailed descriptions of the embodiments of the methods and compositions are not intended to limit the scope of the invention, as claimed, but are merely representative of present embodiments of the invention.

In general, the figures disclose an invention comprising an electrothermal composition which may comprise a coating and polymer composite. The electrothermal coating includes a low dimensional carbon nanostructure.

In the following description, numerous references will be made to nanostructures, low-dimensional nanostructure mixtures and percolation limits. However, it should be understood that one of ordinary skill in the art and in possession of this disclosure, would readily understand how the present invention and electrothermal coatings can be incorporated.

In some embodiments the polymer matrix can comprise at least one of polysiloxane (PSX), siloxane monomers, polyacrylate (acrylic latex), polyacetylene (PAC), polyphenylene vinylene (PPV), polyurethane (PU), polyaniline (PANI), polythiophene (PT), polypyrrole (PPY), polyphenylene sulfide (PPS), and polyquinoline (PQ).

In some embodiments the nanostructure mixture can comprise at least two low-dimensional nanostructures while the nanostructure mixture can be below a percolation limit of each of the at least two low-dimensional nanostructures within the polymer matrix when the composition is cured. In one embodiment, the low-dimensional nanostructures can be at least one of a nanospheriod, a linear nanostructure, a planar nanostructure, and combinations of these materials.

In some embodiments the nanostructure mixture may comprise a first nanostructure mixture wherein a first nanostructure is above the percolation limit and the second nanostructure is below the percolation limit. In some embodiments the percolation limit is exceeded and the viscosity of the matrix, prior to cure, is increased.

Figure 1:
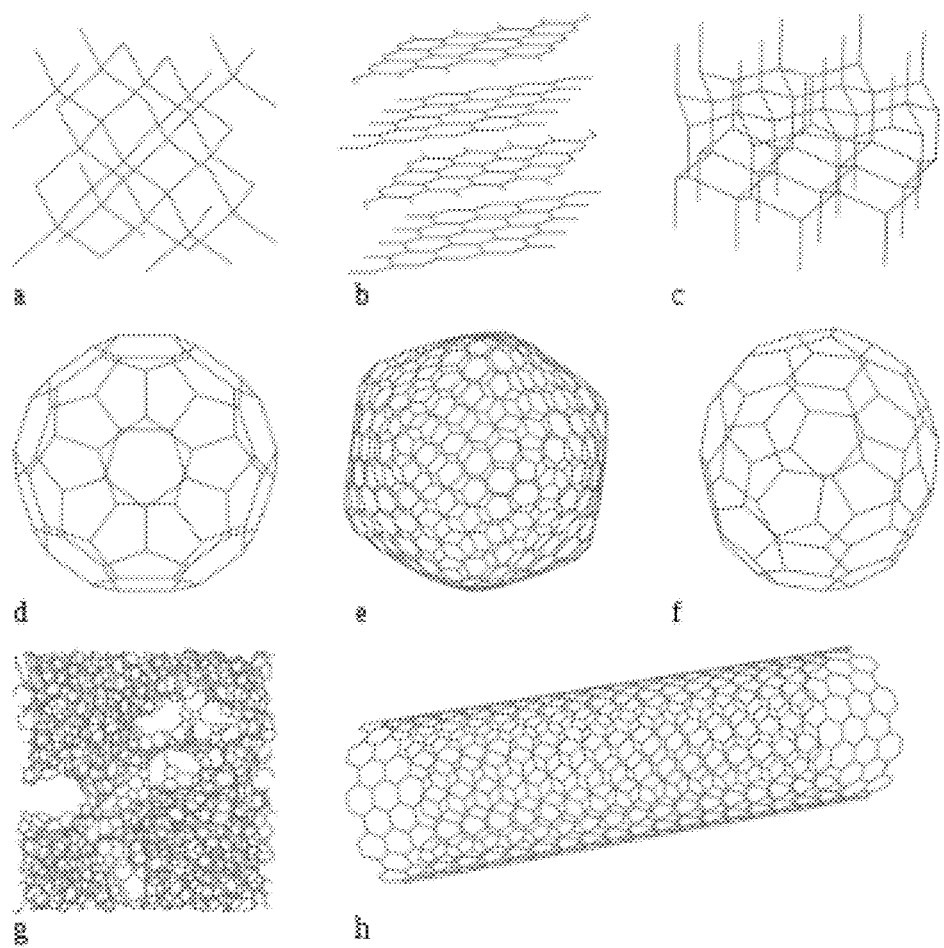
FIG. 1 shows a variety of nanostructures.

In some embodiments the electrothermal (ET) coating can be comprised of any combination of low dimensional carbon nanostructures. In one embodiment, the low dimensional nanostructures can be selected from 0(zero) D carbon nanostructures, 1D carbon nanostructures, 2D carbon nanostructures, or a combination thereof. In some embodiments a non-limiting list of examples of 0D carbon nanostructures can include carbon black, fullerenes, hollow graphitic carbon nanospheres (HCN), porous carbon nanospheres, carbon onions, schwartzites, and carbon nanocages. A non-limiting list of examples of 1D carbon nanostructures can include carbon nanotubes (CNT), single walled CNT (SWCNT), multiple walled CNT (MWCNT), meta-carbon nanotubes, chiral carbon nanotubes, doped carbon nanotubes, fullerene nanowires, and doped fullerene nanowires. A non-limiting list of examples of 2D carbon nanostructures can include graphene, graphene oxide (GO), intercalated graphene, exfoliated graphene, and carbon nanotubes in planar arrays. Referring to FIG. 1, 8 alllotropes of carbon include: Eight allotropes of carbon: a) diamond, b) graphite, c) lonsdaleite, d) C60 buckminsterfullerene, e) C540, Fullerite f) C70, g) amorphous carbon, and h) single-walled carbon nanotube. In some embodiments the nanostructures are discrete nanotubes.

In some embodiments the nanostructure types in the ET coating can include any combination of a nanospheroid, a linear nanostructure, and/or a planar nanostructure. For example, in one aspect, the nanostructure mixture can consist of a nanospheroid and a linear nanostructure. Alternatively, in another aspect, the nanostructure mixture can consist of a nanospheroid and a planar nanostructure. Yet, as another alternative, the nanostructure mixture can consist of a nanospheroid, a linear nano structure, and a planar nano structure. Regardless, concentration of the mixed nanostructures within the cured polymer composite coating is below the percolation limit of each individual carbon nanostructure type, alone, within an identical polymer matrix. Any variety of low-dimensional nanostructures can be used. The nanospheroid can be any one or a combination of carbon black, fullerenes, hollow graphitic carbon nanospheres (HCN), porous carbon nanospheres, carbon onions, schwartzites, doped fullerenes, carbon bucky balls, and carbon nanocages, although other nanospheroids can be suitable. The linear nanostructure can be any one or combination of carbon nanotubes (CNT), single walled CNT (SWCNT), multiple walled CNT (MWCNT), meta-carbon nanotubes, chiral carbon nanotubes, doped carbon nanotubes, fullerene nanowires, and doped fullerene nanowires, although other linear nanostructures can also be used. The planar nanostructure can be any one or combination of graphene, graphene oxide (GO), intercalated graphene, exfoliated graphene, and carbon nanotubes in planar arrays, although other planar nanostructures can also be used.

In some embodiments the quantity of nanostructures within the polymer matrix can vary based on the type of nanostructures in the ET coating and the desired use. While the percolation limit can vary, percolation limits from about 8 to about 25 weight percent can be achieved for mixtures of graphene and polysiloxane. As a general guideline, concentrations of nanostructures can range from about 5 wt. % to about 20 wt. %. In another embodiment, the concentration of nanostructures can range from about 3 wt. % to about 50 wt. %. In yet another embodiment, the concentration of nanostructures can range from about 10 wt. % to about 30 wt. %. Similarly, ratios of 0D to 1D and 2D nanostructures can range from about 1 wt. % to about 50 wt. %. The percolation limit concentration of any low dimensional carbon nanostructure-polymer composite can be reduced to below the statistical percolation limit by preparing the nanostructure filler as a random mixture of 0D with any one or more of 1D and 2D nano structures. Regardless of the concentration of the mixed nanostructures within the cured polymer composite coating, the concentration can be below the percolation limit of each individual carbon nanostructure type, alone, within an identical polymer matrix.

In some embodiments the ET coating can be coated on many different types of substrates. From Polyethylene terephthalate (PET), cloth fabrics, leathers, and wood. Electrical traces are then added to conduct the electrical conductivity throughout the ET. Electrical traces can be conductive inks (silver, copper, etc.), electrical tape ribbon (copper, silver, carbon fiber tape), or by conductive wiring. This in turn enables the coating to achieve a highly controllable heating temperature, a non-limiting example in the range of 40° C. to 80° C. using either 110V AC or 12 to 24V DC power input In some embodiments the ET coating can be applied to the substrate using any number of techniques. The exact technique used will vary based on the form of the ET coating, the intended use, and the substrate. Exemplary application methods can include but are not limited to, screen printing, spray coating, gap coating, gravure coating, inkjet coating, immersion coating, and the like. For example, the ET coating can be applied to a back surface of ceramic tiles which include electrical connectors to an electrical source or an adjacent tile having a similar ET coating. With respect to a cloth article the coating can be applied to the individual fibers before the article is woven or can be interweaved with the fibers in the article.

Some examples of uses for the material are: Car seat warmers (any type of seating like arena and stadium seating, golf cart, and the like); Catering industry (food warmers, catering bags, delivery bags, and the like); Battery warmers (solar, automotive, airline, and the like); Heated driveways; Heated floors (residential or commercial flooring); Medical heated blankets; Satellite TV dishes; Clothing; Medical; De-icers.

In some embodiments a composition useful for electrothermal coatings comprising a polymer matrix; and a nanostructure mixture mixed into the polymer matrix the nanostructure mixture comprising at least two low-dimensional nanostructures wherein the nanostructure mixture is below the percolation limit of each of the at least two low-dimensional nanostructures within the polymer matrix when the composition is cured is disclosed. In some embodiments the nanostructure mixture is evenly mixed into the polymer matrix. In some embodiments the nanostructure mixture comprises at least two low-dimensional nanostructures. In some embodiments the first nanostructure comprises a 0D structure. In some embodiments the first nanostructure the first nanostructure comprises a 1D structure. In some embodiments the first nanostructure comprises a 2D structure. In some embodiments the first nanostructure that may comprise a 0D, 1D or 2D structure may be mixed with a second nanostructure that may comprise a 0D, 1D, or 2D structure. In some embodiments the nanostructure is selected based on the properties of the polymer matrix into which the nanostructures are being mixed.

In some embodiments at least one of the two low-dimensional nanostructures is above the percolation limit and at least one nanostructure mixture is below the percolation limit of each of the at least two low-dimensional nanostructures within the polymer matrix when the composition is cured. In some embodiments both of the low-dimensional nanostructures is above the percolation limit within the polymer matrix when the composition is cured. In some embodiments both of the low-dimensional nanostructures is below the percolation limit within the polymer matrix when the composition is cured. In some embodiments the nanostructure mixture comprises a plurality of low-dimensional nanostructures, including 0D, 1D and 2D nanostructures.

In some embodiments the polymer matrix comprises a species selected from the group consisting of polysiloxane (PSX), siloxane monomers, polyacrylate (acrylic latex), polyacetylene (PAC), polyphenylene vinylene (PPV), polyurethane (PU), polyaniline (PANI), polythiophene (PT), polypyrrole (PPY), polyphenylene sulfide (PPS), and polyquinoline (PQ).

In some embodiments the nanostructure in the mixture is selected from 0D carbon nanostructures comprising carbon black, fullerenes, hollow graphitic carbon nanospheres (HCN), porous carbon nanospheres, carbon onions, schwartzites, and carbon nanocages.

In some embodiments the nanostructure mixture is selected from 1D carbon nanostructures comprising carbon nanotubes (CNT), single walled CNT (SWCNT), multiple walled CNT (MWCNT), meta-carbon nanotubes, chiral carbon nanotubes, doped carbon nanotubes, fullerene nanowires, and doped fullerene nanowires.

In some embodiments the nanostructure mixture is selected from 2D carbon nanostructures comprising graphene, graphene oxide (GO), intercalated graphene, exfoliated graphene, and carbon nanotubes in planar arrays.

In some embodiments the nanostructure mixture is a combination of 0D, 1D and 2D carbon nanostructures.

In some embodiments the nanostructure comprises a combination of nanospheroid, a linear nanostructure, and/or a planar nanostructure.

In some embodiments the planar nanostructures comprise any one or combination of graphene, graphene oxide (GO), intercalated graphene, exfoliated graphene, and carbon nanotubes in planar arrays.

In some embodiments the nanospphereoid comprises a combination of carbon black, fullerenes, hollow graphitic carbon nanospheres (HCN), porous carbon nanospheres, carbon onions, schwartzites, doped fullerenes, carbon bucky balls, and carbon nanocages.

In some embodiments the concentration of the mixed nanostructures within the cured polymer composite coating is below the percolation limit of each individual carbon nanostructure type, alone, within an identical polymer matrix.

In some embodiments a composition useful for electrothermal coatings comprises: a polymer matrix; and a nanostructure mixture mixed into the polymer matrix the nanostructure mixture comprising at least two low-dimensional nanostructures wherein the nanostructure mixture is below the percolation limit of each of the at least two low-dimensional nanostructures within the polymer matrix when the composition is cured; wherein the quantity of nanostructures within the polymer matrix can vary based on the type of nanostructures in the ET coating and the desired use. While the percolation limit can vary, percolation limits from about 8 to about 25 weight percent can be achieved for mixtures of graphene and polysiloxane.

In some embodiments the concentrations of nanostructures can range from about 5 wt. % to about 20 wt. %.

In some embodiments the concentration of nanostructures can range from about 10 wt. % to about 30 wt. %.

In some embodiments the ratios of 0D to 1D and 2D nanostructures can range from about 1 wt. % to about 50 wt. %.

In some embodiments a method of preparing a composition comprises: providing a polymer matrix; providing a nanostructure mixture mixed into the polymer matrix the nanostructure mixture comprising at least two low-dimensional nanostructures wherein the nanostructure mixture is below the percolation limit of each of the at least two low-dimensional nanostructures within the polymer matrix when the composition is cured; wherein the percolation limit concentration of the low dimensional carbon nanostructure-polymer composite can be reduced to below the statistical percolation limit by preparing the nanostructure filler as a random mixture of 0D with any one or more of 1D and 2D nanostructures; and wherein the concentration of the mixed nanostructures within the cured polymer composite coating is below the percolation limit of each individual carbon nanostructure type, alone, within an identical polymer matrix.

In some embodiments the method of preparing a composition comprises applying the composition to a substrate selected from the group consisting of Polyethylene terephthalate (PET), cloth fabrics, leathers, concrete, plastic, stone and wood.

In some embodiments the method of preparing the composition comprises blending a polymer matrix and a first nanostructure in a high-sheer mixer for 45 minutes. In some embodiments the process is iterative with additional nanostructure added in selective rations, such as an additional 10% by weight of nanostructure, while in some embodiments an additional 10% by volume is added. In some embodiments the process is repeated. In some embodiments, a second nanostructure is added after the addition of the first nanostructure to the polymer is completed. In some embodiments at least one component of the nanostructure mixture exceeds the of percolation limit. In some embodiments the high-sheer mixer mixes the nanostructure mixture and the polymer matrix for 1 hour until the nanostructure is evenly distributed through the matrix. In some embodiments the nanostructures comprise the low dimensional nanostructures selected from 0D carbon nanostructures, 1D carbon nanostructures, 2D carbon nanostructures, or a combination thereof. In some embodiments a non-limiting list of examples of 0D carbon nanostructures can include carbon black, fullerenes, hollow graphitic carbon nanospheres (HCN), porous carbon nanospheres, carbon onions, schwartzites, and carbon nanocages. A non-limiting list of examples of 1D carbon nanostructures can include carbon nanotubes (CNT), single walled CNT (SWCNT), multiple walled CNT (MWCNT), meta-carbon nanotubes, chiral carbon nanotubes, doped carbon nanotubes, fullerene nanowires, and doped fullerene nanowires. A non-limiting list of examples of 2D carbon nanostructures can include graphene, graphene oxide (GO), intercalated graphene, exfoliated graphene, and carbon nanotubes in planar arrays. In some embodiments the matrix is allowed to cure once the nanostructure is evenly distributed through the mixture.

Figure 2:
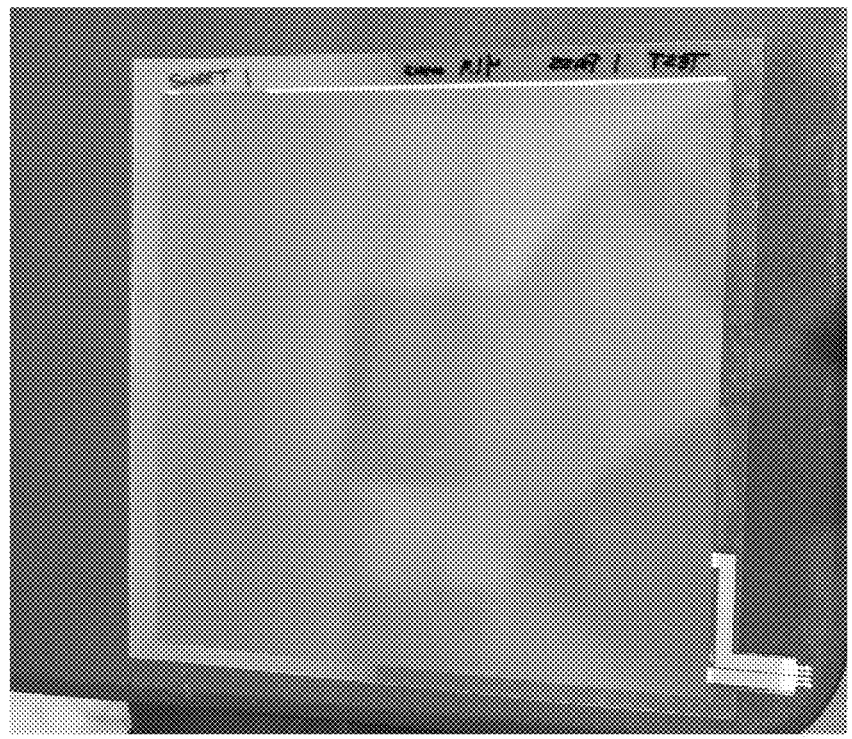
FIG. 2 shows an embodiment of an applied coating.
Figure 3:
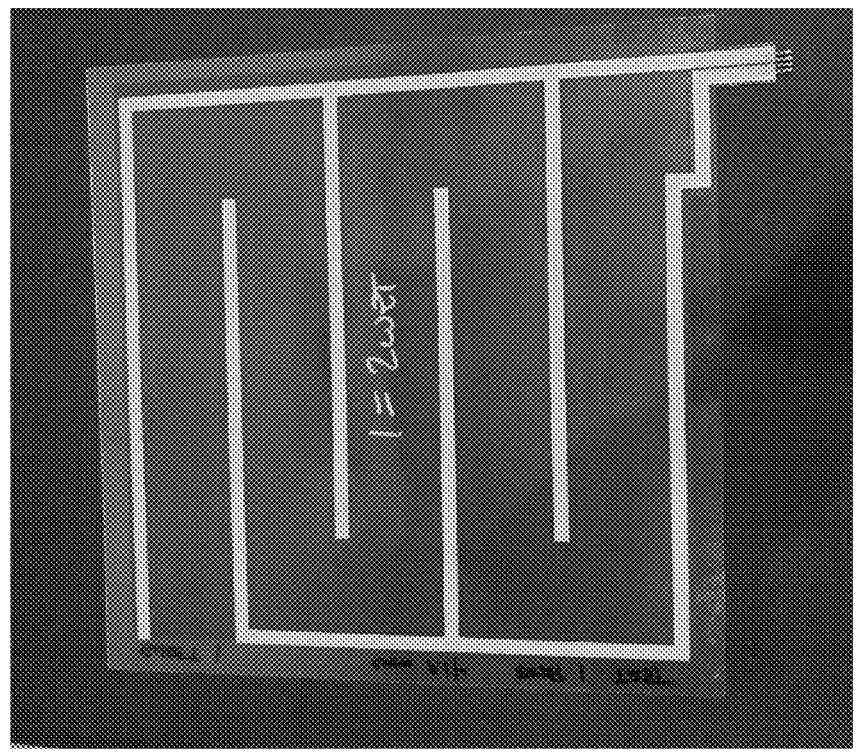
FIG. 3 shows an embodiment of an applied coating.

Referring now to FIGS. 1-2, in some embodiments the electrical traces are added to the applied composition configured to conduct electricity through the applied composition, wherein the traces comprise a conductive ink (silver, copper, etc.), an electrical tape ribbon (copper, silver, carbon fiber tape), or by conductive wiring.

In some embodiments the applied composition is configured to maintain a temperature between the range of 40° C. to 80° C. using either 110V AC or 12 to 24V DC power input.

In some embodiments the composition is applied using a technique consisting of screen printing, spray coating, gap coating, gravure coating, inkjet coating, and immersion coating, or a combination of techniques.

In closing, it is to be understood that the embodiments of the disclosure disclosed herein are illustrative of the principles of the present disclosure. Other modifications that may be employed are within the scope of the disclosure.

Thus, by way of example, but not of limitation, alternative configurations of the present disclosure may be utilized in accordance with the teachings herein. Accordingly, the present disclosure is not limited to that precisely as shown and described.

What is claimed is:

1. A composition useful for electro-thermal coatings comprising: a polymer matrix; and
a nanostructure mixture evenly mixed into the polymer matrix the nanostructure mixture comprising at least two low-dimensional nanostructures wherein at least a first one of the two low-dimensional nanostructures is above a percolation limit and at least a second one of the two low-dimensional nanostructures is below the percolation limit when the composition is cured, wherein the first one of the two low-dimensional nanostructures and the second one of the two low-dimensional nanostructures comprise different materials.

2. The composition of claim 1 wherein the polymer matrix comprises a species selected from the group consisting of polysiloxane (PSX), siloxane monomers, polyacrylate (acrylic latex), polyacetylene (PAC), polyphenylene vinylene (PPV), polyurethane (PU), polyaniline (PANI), polythiophene (PT), polypyrrole (PPY), polyphenylene sulfide (PPS), and polyquinoline (PQ).

3. The nanostructure mixture of claim 1 wherein the mixture is selected from 0D carbon nanostructures comprising carbon black, fullerenes, hollow graphitic carbon nanospheres (HCN), porous carbon nanospheres, carbon onions, schwartzites, and carbon nanocages.

4. The nanostructure mixture of claim 1 wherein the mixture is selected from 1D carbon nanostructures comprising carbon nanotubes (CNT), single walled CNT (SWCNT), multiple walled CNT (MWCNT), meta-carbon nanotubes, chiral carbon nanotubes, doped carbon nanotubes, fullerene nanowires, and doped fullerene nanowires.

5. The nanostructure mixture of claim 1 wherein the mixture is selected from 2D carbon nanostructures comprising graphene, graphene oxide (GO), intercalated graphene, exfoliated graphene, and carbon nanotubes in planar arrays.

6. The nanostructure mixture of claim 1 wherein the mixture is a combination of 0D, 1D and 2D carbon nanostructures.

7. The nanostructure of claim 1 comprising a combination of a nanospheroid, a linear nanostructure, and/or a planar nanostructure.

8. The composition of claim 5 wherein the planar nanostructures comprise any one or combination of graphene, graphene oxide (GO), intercalated graphene, exfoliated graphene, and carbon nanotubes in planar arrays.

9. The nanospheroid of claim 7 wherein the nanospheroid comprises a combination of carbon black, fullerenes, hollow graphitic carbon nanospheres (HCN), porous carbon nanospheres, carbon onions, schwartzites, doped fullerenes, carbon bucky balls, and carbon nanocages.

10. The composition of claim 1 wherein concentration of the mixed nanostructures within the cured polymer composite coating is below a percolation limit of each individual carbon nanostructure type, alone, within an identical polymer matrix.

11. A composition useful for electro-thermal coatings comprising: a polymer matrix; and
a nanostructure mixture mixed into the polymer matrix the nanostructure mixture comprising at least two low-dimensional nanostructures wherein at least a first one of the two low-dimensional nanostructures is above a percolation limit and at least a second one of the two low-dimensional nanostructures is below the percolation limit when the composition is cured, wherein the first one of the two low-dimensional nanostructures and the second one of the two low-dimensional nanostructures comprise different materials;
wherein a quantity of nanostructures within the polymer matrix can vary based on the nanostructures in an electrothermal (ET) coating and a desired use, while the percolation limit can vary, percolation limits from about 8 to about 25 weight percent can be achieved for mixtures of graphene and polysiloxane.

12. The composition of claim 11 wherein the concentrations of nanostructures can range from about 5 wt. % to about 20 wt. %.

13. The composition of claim 11 wherein the concentration of nanostructures can range from about 10 wt. % to about 30 wt. %.

14. The composition of claim 11 wherein the ratios of 0D to 1D and 2D nanostructures can range from about 1 wt. % to about 50 wt. %.

* * * * *